TWO STAGE DIRECT-COUPLED TRANSISTOR AMPLIFIER UTILIZING
D.C. POSITIVE FEEDBACK AND D.C.-A.C. NEGATIVE FEEDBACK
Filed Feb. 6, 1964
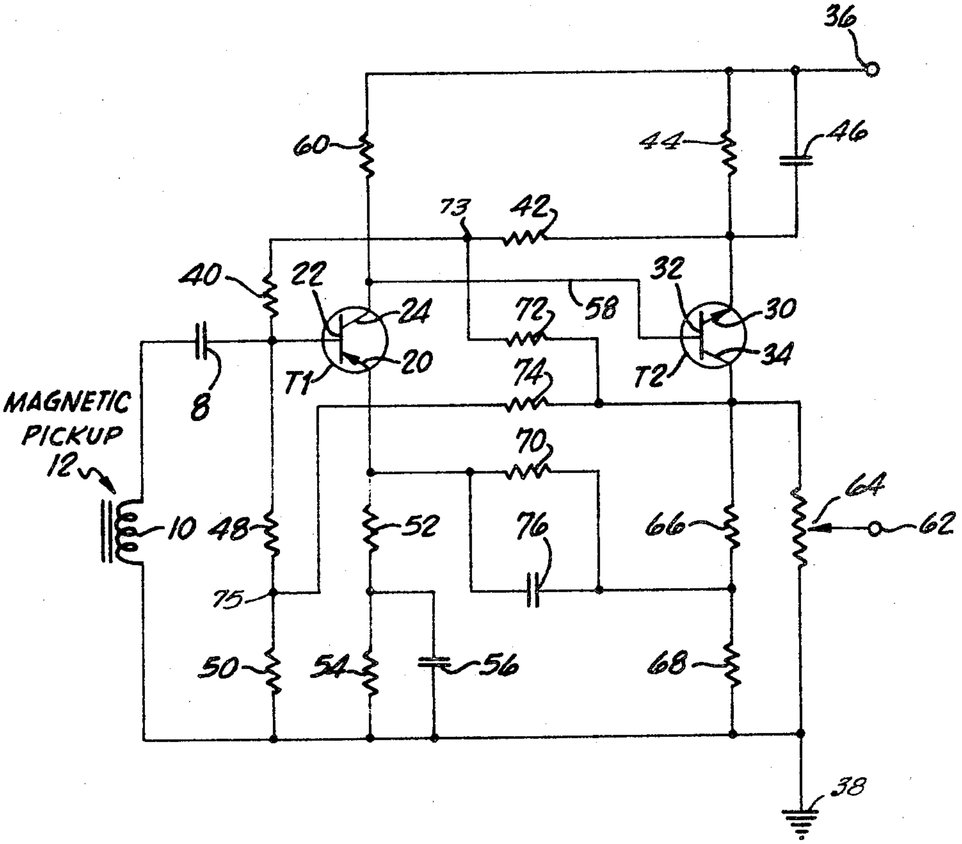
ROBERT L. DAVIS and
DONALD M. PATTERSON
INVENTORS
BY James H. Griffin
ATTORNEY 3,267,386

TWO STAGE DIRECT-COUPLED TRANSISTOR AMPLIFIER UTILIZING D.C. POSITIVE FEEDBACK AND D.C.-A.C. NEGATIVE FEEDBACK

Robert L. Davis, Redwood City, and Donald M. Patterson, Sunnyvale, Calif., assignors to Ampex Corporation, Redwood City, Calif., a corporation of California Filed Feb. 6, 1964, Ser. No. 343,029
4 Claims. (Cl. 330—17)

This application relates to amplifiers and more particularly to pre-amplifiers for use in the playback circuitry of magnetic tape recorders and the like.

Since the voltage developed across ceramic transducers, crystal microphones, or magnetic tape recorder playback coils is so low in amplitude as to be insufficient to drive the first stage of the standard audio amplification system, it is customary to apply such signals to a pre-amplifier, which increases them to about 1 volt so that they can emerge from the main amplification system at the proper voltage level. A pre-amplifier is designed also to reduce noise and hum and to provide a high input impedance.

The transistor being of low input impedance when used in amplification circuits, a transistorized pre-amplifier must have a resistor, choke, emitter-follower transistor, or some more complicated arrangement in its input circuit to avoid overloading the signal source. Each of these elements has its disadvantages. A series resistor, for example, attenuates the input signal, thus reducing the total amplification achievable, and increases also the noise factor of the system. A choke limits the frequency response of the system and, of course, is relatively bulky. Likewise, the emitter-follower transistor, often used, imposes an upper limit on the input impedance achievable, not to mention the attendant complications arising from the bias circuitry, stability, and selection of the transistor. Because of the above-described difficulties arising with each of the various components used in the input circuit of a pre-amplifier, designers have resorted to feedback circuits of various sorts in order to achieve proper operation of a transistor pre-amplifier; but previously, the feedback solution has resulted in a low upper temperature limit and has required very careful and individualized selection and periodic adjustment of components.

The general object of this invention is to provide an improved pre-amplifier system.

Another object of this invention is to provide a transistorized pre-amplifier which has a sufficiently high input impedance.

Another object is to provide a high input impedance transistorized pre-amplifier using feedback rather than resistors, chokes, or transistors in the input circuit.

Another object is to provide a transistor pre-amplifier that is temperature stable and does not require excessive care in the selection of components.

Another object is to provide a pre-amplifier that retains its relative gain both at very low frequencies and at very high frequencies.

In the achievement of the above objects and in accordance with a feature of the present invention, there is provided a pre-amplifier circuit having one N-P-N transistor and one P-N-P transistor, with the collector of the first transistor coupled to the base of the second and the collector of the second transistor coupled to the output terminal of the circuit. An A.C.-D.C. feedback network originates at the collector of the second transistor and carries degenerative D.C. feedback to the emitter of the first transistor, regenerative D.C. feedback, to the base of the first transistor, and degenerative A.C. feedback to the emitter of the first transistor.

The above-described pre-amplifier thus ensures that the transducer which provides its input meets a sufficiently high impedance. Moreover, the feedback network maintains good stability, both as to temperature variation and as to the variation of the characteristics of individual components; and the gain of the amplifier remains consistently high throughout the entire range of input frequencies.

Other objects and features and a fuller understanding of the invention may be had by referring to the following description and claims, taken in conjunction with the accompanying drawing, in which there is shown the circuit diagram of a preferred embodiment of a pre-amplifier in accordance with the invention.

Referring to the figure, a preferred version of the pre-amplifier circuit is shown coupled through the D.C. blocking capacitor 8 to a winding 10 of a magnetic pickup 12 the output of which requires pre-amplification. The pre-amplifier comprises the transistors, T1, T2, having their respective emitters 20, 30, bases 22, 32, and collectors 24, 34. The specific circuit here shown operates between a power supply 36 of —12 v. and ground 38.

The base 22 of the transistor T1 is connected to the power supply 36 through resistor 40, 42, and 44. A capacitor 46, in parallel with the resistor 44, provides a by-pass path for A.C. between the emitter 30 and power supply. The base 22 is coupled to ground through resistors 48, 50. The emitter 20 of the transistor T1 is coupled to ground through resistors 52, 54. A capacitor 56 practically grounds the emitter 20 as to A.C., in as much as the resistor 52 is relatively small. The collector 24 is directly coupled at 58 to the base 32 of the transistor T2. The collector 24 and the base 32 are connected to the power supply 36 through a resistor 60.

The output of the pre-amplifier circuit is taken at a terminal 62 between the collector 34 and ground 38 and may be attenuated to the optimum level for the main stages of amplification by a voltage divider 64. Resistors 66, 68 are coupled in parallel with the voltage divider 64 between the collector 34 and ground 38.

Degenerative D.C. feedback, in the preferred embodiment here described, is accomplished by coupling a resistor 70 between the collector 34 (though the resistor 66) and the emitter 20.

The regenerative D.C. feedback function in the circuit described is performed by two resistors 72, 74 each coupled to the collector 34 at one end. The other end of the resistor 72 is connected at the junction 73 between the resistor 40 and the resistor 42, in the power supply portion of the bias circuitry of the base 22 of the transistor T1. The resistor 74 is coupled into the ground portion of the T1 base bias circuit, at the junction 75 between resistors 48 and 50. In the preferred embodiment the resistors 72 and 74 are equal, the resistors 40 and 48 are equal, and the sum of the resistors 42 and 44 approximately equals the value of the resistor 50.

Degenerative A.C. feedback is supplied to the emitter 20 of the transistor T1 by coupling a capacitor 76 in parallel with the resistor 70.

In the operation of the above-described circuit, in the absence of input signals across the winding 10, the transistor T1 has its base 22 just slightly negative of its emitter 20; thus transistor T1 is conducting. Likewise, transistor T2 is in the conductive state, and the current from its collector 34 is causing current flow in the feedback circuit resistors 70, 72, and 74.

When a signal appears across the winding 10, it is passed by the D.C. blocking capacitor 8 to the base 22 of the transistor T1. The transistor T1, being in the grounded emitter configuration, produces at its collector 24 a great amplification of the original input signal; this amplification at the collector 24 becomes the input to the transistor T2 at its base 32.

Transistor T2 creates an even greater current gain in the original input signal at its collector 34, which is directly coupled to the output terminal 62. Part of this T2 collector current serves to augment the input signal by being returned to the base through the resistors 72 and 74. The positive-going parts of the output signal increase the current flow at the junction 73, which stays at a voltage negative of the collector 34; while the current drawn from the junction 75 decreases. The negative-going parts of the signal having just the opposite effect at each junction, the overall result is the augmentation of the input signal current to the base 22 and the raising of the pre-amplifier input impedance.

Feedback from the collector 34 is fed through the voltage divider 66 and the elements 70, 76 to the emitter 20 of the transistor T1. This is degenerative feedback, because the emitter 20 is negative relative to the collector 34; thus unwanted changes in the operating voltages of either of these electrodes will be mitigated by the resistor 70. If the unwanted change leaves the voltages farther apart, more current flows through the resistor 70. Likewise, if the unwanted change brings the operating voltages of the electrodes 20, 34 closer together, the resistor 70 will pass less current than it ordinarily would. The capacitor 76 performs about the same way with A.C. signals, the higher the frequency, the more so.

A pre-amplifier in accordance with the above description and drawing was built and operated using the following components.

Power Supply:

| | |
|---|---|
| **36** | 12 v. D.C. |

Transistors:

| | |
|---|---|
| T1 | 2N1379 |
| T2 | 2N444 |

Resistors (ohms):

| | | | |
|---|---|---|---|
| **40** | 22K | **60** | 8.2K |
| **42** | 18K | **64** | 10K |
| **44** | 4.7K | **66** | 6.2K |
| **48** | 22K | **68** | 3.9K |
| **50** | 22K | **70** | 47K |
| **52** | 22K | **72** | 390K |
| **54** | 7.5K | **74** | 390K |

Capacitors ($\mu$f):

| | | | |
|---|---|---|---|
| **8** | 15 | **56** | 125 |
| **46** | 125 | **76** | .047 |

Thus, in accordance with the present invention there is provided a transistor pre-amplifier with feedback-produced high input impedance, temperature stability, and frequency response equalization. Although the invention is described with a certain degree of particularity, it is to be understood that the present disclosure has been made only by way of example and that numerous changes in the details of construction and the combination and arrangement of parts (e.g. substituting PNP for NPN transistors, and vice versa) may be resorted to without departing from the spirit and the scope of the invention as hereinafter claimed.

What is claimed is:

1. A pre-amplifier circuit including two transistors, each having an emitter, a base, and a collector; means coupling the collector of the first said transistor to the base of the second said transistor; degenerative D.C. feedback means coupled between the collector of the second said transistor and the emitter of the first said transistor; bias circuitry coupled to the base of said first transistor including a power supply, a connection to ground, and resistors connected between said power supply and the base of said first transistor and between the base of said first transistor and said connection to ground; regenerative D.C. feedback means coupled between the collector of the second said transistor and resistively separated therefrom and two points in said bias circuitry respectively on opposite sides of the base of the first said transistor; and degenerative A.C. feedback means coupled between the collector of the second said transistor and the emitter of the first said transistor.

2. A pre-amplifier circuit including two transistors, each having an emitter, a base, and a collector; means coupling the collector of the first said transistor to the base of the second said transistor; a resistor coupled between the collector of the second said transistor and the emitter of the first said transistor; bias circuitry coupled to the base of said first transistor including a power supply, a connection to ground, and resistors connected between said power supply and the base of said first transistor and between the base of said first transistor and said connection to ground; regenerative D.C. feedback means coupled between the collector of the second said transistor and two points in said bias circuitry respectively on opposite sides of the base of the first said transistor and resistively separated therefrom; and a capacitor coupled between the collector of the second said transistor and the emitter of the first said transistor.

3. A pre-amplifier circuit including two transistors, one PNP and one NPN, each having an emitter, a base, and a collector; bias circuitry coupled to the base of the first said transistor and including a power cupply, a connection to ground, and resistors between said power supply and said base and between said base and said connection to ground; means coupling the collector of the first said transistor to the base of the second said transistor; a resistor coupled between the collector of the second said transistor and the emitter of the first said transistor; two resistors of equal value coupled from the collector of said second transistor to two points in said bias circuitry on opposite sides of the base of said first transistor and separated from the base of said first transistor by resistances of equal value; and a capacitor coupled between the collector of the second said transistor and the emitter of the first said transistor.

4. A pre-amplifier circuit including first and second transistors, each having an emitter, a base, and a collector; bias circuitry coupled to the base of said first transistor including a power supply, a connection to ground, and resistors between said power supply and the base of said first transistor and between the base of said first transistor and said connection to ground; means coupling the collector of said first transistor to the base of said second transistor; two resistors of equal value coupled from the collector of said second transistor respectively to two points in said bias circuitry on opposite sides of the base of said first transistor and separated therefrom by resistors of equal value; degenerative D.C. feedback means coupled between the collector of said second transistor and the emitter of said first transistor; and degenerative A.C. feedback means coupled between the collector of said second transistor and the emitter of said first transistor.

References Cited by the Examiner

UNITED STATES PATENTS 3,121,201 2/1964 Bernstein-Bervery et al. 330—17 X
3,166,719 1/1965 Wiencek 330—17

FOREIGN PATENTS 1,139,155 11/1962 Germany.
1,159,512 12/1963 Germany.

ROY LAKE, *Primary Examiner.*

R. P. KANANEN, N. KAUFMAN, *Assistant Examiners.*